April 11, 1950 G. L. HOLLINGSWORTH 2,503,909

PULSE AMPLIFIER

Filed Jan. 16, 1947

Inventor:
Guilford L. Hollingsworth,
by Merton D. Morse
His Attorney.

Patented Apr. 11, 1950

2,503,909

UNITED STATES PATENT OFFICE 2,503,909

PULSE AMPLIFIER

Guilford L. Hollingsworth, Seattle, Wash., assignor to General Electric Company, a corporation of New York Application January 16, 1947, Serial No. 722,354

4 Claims. (Cl. 178—44)

Figure 1:
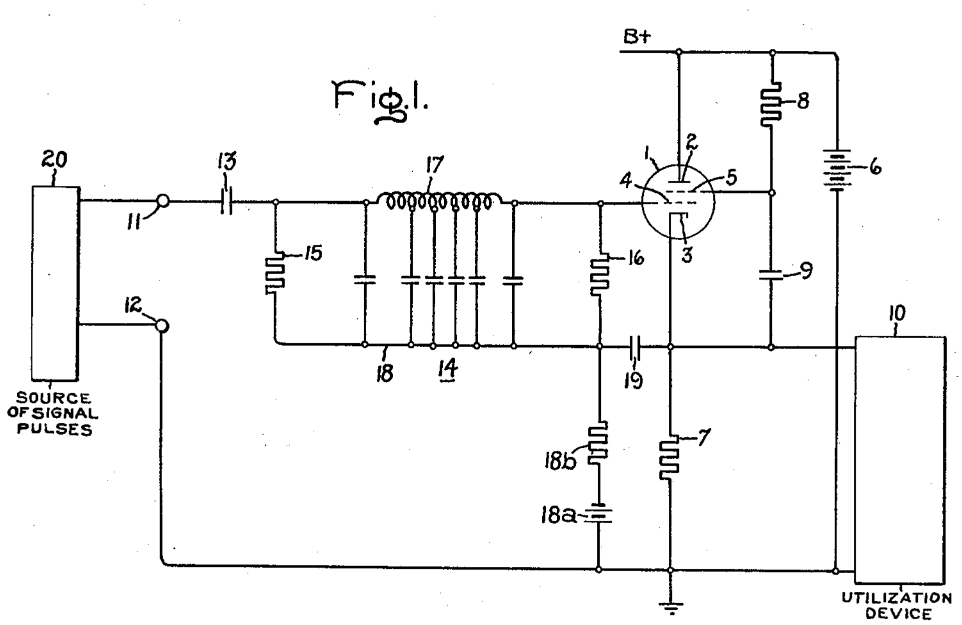

My invention relates to pulse amplifiers and particularly to such amplifiers which are nonconducting except when a pulse is impressed thereon in a positive sense.

In order that amplifiers which are employed for amplifying pulses of short duration may operate with reasonable efficiency, it is necessary that all the electron discharge devices be normally nonconducting. This prevents the drawing of anode current except during the amplification of the pulses. The so-called "cathode follower" type of amplifier has been employed for this purpose since the input and output are in phase. However, because of degeneration caused by the load resistor the gain of this type of amplifier is less than one. It is desirable to employ a cathode output amplifier in order to avoid phase reversal. Accordingly, it is an object of my invention to provide a pulse amplifier including an electron discharge device having its output connected between the cathode and the point of reference potential and which shall have a gain greater than one.

It is another object of my invention to provide an electronic amplifier for amplifying pulses to a substantial degree without change in phase.

Figure 2:
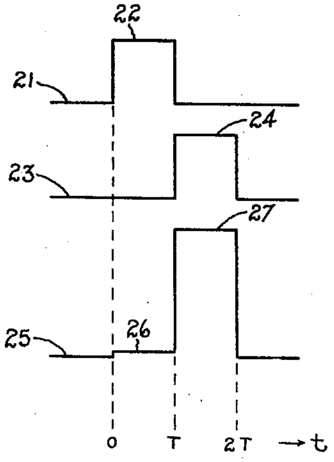
Figure 3:
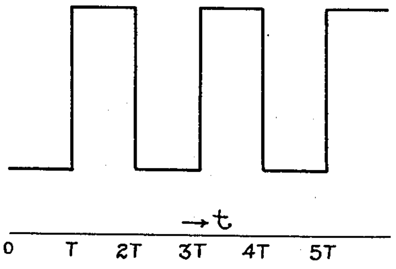

The novel features which I believe to be characteristic of my invention are set forth with particularity in the appended claims. My invention itself, however, both as to its organization and method of operation, together with further objects and advantages thereof, may best be understood by reference to the following description taken in connection with the accompanying drawing in which Fig. 1 represents diagrammatically an amplifier embodying my invention; Fig. 2 represents curves illustrating certain operating characteristics of the amplifier shown in Fig. 1; and Fig. 3 represents a curve illustrating further characteristics.

Referring now to the drawing, the amplifier illustrated in Fig. 1 includes an electron discharge device 1 having an anode 2, a cathode 3, a control electrode 4 and a screen electrode 5. A suitable source of direct current, such as a battery 6, is connected to the anode 2 and the anode-to-cathode circuit is completed by a load resistor 7 connected in the circuit between the cathode 3 and ground or other suitable point of reference potential. The potential of the screen grid is determined by a voltage divider including a resistance 8, a capacitor 9 and the resistance 7. A load circuit or utilization device 10 is connected across the resistance 7. The signal pulse to be amplified is impressed on the amplifier between terminals 11 and 12, terminal 12 being connected to ground. In order that a positive pulse impressed on the amplifier across the terminals 11 and 12 may be amplified without degeneration because of the presence of the cathode resistor 7, the terminal 11 is coupled to the grid 4 through a capacitor 13 and a time delay line 14, which has been represented as an artificial transmission line having its input terminals connected across a resistance 15 and its output terminals across a resistance 16. The manner in which the delay line operates to prevent degeneration and to facilitate full amplification of the signal will be explained later. One side of the line represented as including inductance 17 is connected between the capacitor 13 and the control electrode 4 and the other side of the line indicated at 18 and representing the equipotential line is connected between the lower terminals of the resistors 15 and 16. In order to impress the output of the delay line between the cathode 3 and the control electrode 4, the lower terminal of the resistor 16 is connected by a capacitor 19 to the cathode 3. The control electrode 4 is biased to a predetermined cutoff potential by a battery 18*a* connected to the control electrode through resistance 16 and a high resistance 18*b*.

During the operation of the amplifier illustrated, when a positive pulse supplied from a suitable source 20 is impressed between the terminals 11 and 12, the pulse voltage is impressed across a voltage divider including the resistance 7, the capacitance 19 and the resistance 15 in parallel with the input impedance of the delay line 14. The resistance 15 is large by comparison with the resistance of the resistance 7 in parallel with the resistance of the load circuit 10, and only a small portion of the signal voltage appears across the resistance 7 to raise slightly the potential of the cathode 3. Since no current is flowing in the resistor 16 at this instant, the potential of the control electrode 4 rises the same amount as that of the cathode. At the end of a predetermined time determined by the characteristics of the line 14 the signal pulse appears across the resistance 16, capacitor 19 and resistance 7 in series, the major portion of the pulse appearing across the resistance 16, thereby raising the potential of the control electrode 4 and rendering the device 1 conducting Since the side 18 of the transmission line is not tied to ground and is "floating," the increase in potential produced by the flow of current through the resistor 7 merely raises the potential of the line 18 so that the cathode 3 and control electrode 4 are raised an equal amount, and there is no degenerative effect due to the passage of current through the resistor 7. Thus the full amplifying power of the device 1 may be utilized and the load 10 may be connected across the resistance 7 to receive the amplified pulse in a positive sense.

Fig. 2 indicates the characteristics of the amplifier of Fig. 1 when the delay time T of the line 14 is equal to the duration of the impressed signal pulse. The top curve 21 represents the voltage impressed across the terminals of the amplifier 11, 12, the positive pulse being indicated at 22. The curve 23 represents the voltage appearing at the control electrode 4, the pulse indicated at 24 occurring at the end of the predetermined time beginning at the end of the pulse 22 and continuing an equal time. The bottom curve 25 represents the voltage across the resistance 7, a slight rise 26 being effected for the duration of the pulse 22 due to the voltage divider effect and the amplified pulse indicated at 27 appearing across the resistance 7 concurrently with the pulse 24 on the control electrode.

The character of the output pulse depends upon the duration of the impressed pulse. An impressed pulse of shorter duration than the delay time T of the line 14 will be amplified in the normal manner, the output pulse appearing across the resistor 7 beginning at the end of the time T. Should the pulse impressed on the amplifier be of greater duration than the delay time T but not as great as twice the delay time, the output pulse will be cut off sharply at the termination of the delay time. Should the impressed pulse be of greater duration than 2T, a series of square pulses each of a duration T will be produced, as indicated in Fig. 3, the number of pulses being dependent upon the length of the impressed pulse.

The reason for the sharp cutoff characteristic of the device 1 will be apparent from the following. If a pulse with a longer duration than the delay time T of the line 14 but of a duration shorter than 2T is impressed on the input, and if the pulse has a sloping lagging edge, a negative signal produced across the input of the line at the end of the delay period T will cause the pulse to be cut off sharply. The manner in which the negative pulse is produced will be apparent when it is remembered that signal generators, such as the device 20, have a low output impedance so that the terminal 11 is connected to ground through a low impedance. At the end of the time T the side 18 of the delay line goes to a high positive value and since the point 11 is held at ground potential by the low impedance of the generator 20, this point becomes more negative than the side 18 of the line. Consequently a negative wave progresses down the line and arrives at the control electrode at a time 2T. This wave is almost as great in amplitude as the output voltage and consequently the device 1 is cut off very sharply so that the side 18 returns to ground potential, restoring the zero potential condition across the input of the line 14. This characteristic also accounts for the production of the series of square pulses when a pulse of duration greater than 2T is impressed on the input.

From the foregoing, it is readily apparent that I have provided a simple and efficient electronic amplifier for securing adequate amplification of pulses in a positive sense while maintaining an electron discharge device nonconducting except during amplification. Furthermore, the amplifier can be employed to amplify single pulses or to produce square pulses in response to single pulses having sloping characteristics and may also be employed to produce a series of square pulses.

While I have described a specific form of my invention, other embodiments will occur to those skilled in the art, and I intend to cover by the appended claims all modifications coming within the spirit and scope of my invention.

What I claim as new and desire to secure by Letters Patent in United States is:

1. An electronic amplifier for producing a positive pulse in response to a positive signal pulse comprising an electron discharge device having an anode and a cathode and a control electrode, a load circuit for said device including a load resistor connected between said cathode and a point of reference potential, means including an input terminal for connecting a source of signal pulses to said amplifier between said terminal and said point of reference potential, a capacitor having one plate connected to said cathode, a resistance connected between said control electrode and the other plate of said capacitor, and means connected to said terminal for impressing a signal pulse across said resistance a predetermined time after said pulse has been impressed between said input terminal and said point of reference potential, whereby a pulse impressed on said amplifier in a positive sense is amplified and appears across said output resistor in the positive sense a predetermined time after said pulse is impressed on said amplifier.

2. An electronic amplifier for producing a positive pulse in response to a positive signal pulse comprising an electron discharge device having an anode and a cathode and a control electrode, a load circuit for said device including a load resistor connected between said cathode and a point of reference potential, a time delay line having a pair of input terminals and a pair of output terminals, input and terminating resistors connected between the respective ones of said terminals, each of said resistors having a value equal to the characteristic impedance of said line, means including a capacitor connected to the one of said input terminals on one side of said line for impressing a signal pulse in a positive sense between said one input terminal and said point of reference potential, means connecting the output terminal on said one side of said line to said control electrode, and a capacitor connecting the other of said output terminals to said cathode.

3. An electronic amplifier for producing a positive pulse in response to a positive signal pulse impressed thereon comprising an electron discharge device having an anode and a cathode and a control electrode, an output resistance connected in the anode to cathode circuit of said device between said cathode and a point of reference potential, a time delay line having an input terminal and a pair of output terminals, the output terminal corresponding to said input terminal being connected to said control electrode, a capacitor coupling the other of said output terminals to said cathode, and means for impressing a pulse in a positive sense on said amplifier between said input terminal of said line and said point of reference potential, whereby said pulse appears after a predetermined time delay between said control electrode and said point, a substantial portion of said pulse appearing between said cathode and said control electrode.

4. An electronic amplifier for producing a substantially amplified positive pulse in response to a positive signal pulse impressed thereon comprising an electron discharge device having an anode and a cathode and a control electrode, an output resistance connected in the anode-to-cathode circuit of the device between said cathode and a point of reference potential, a time delay line comprising an input terminal connected to one side thereof and a pair of output terminals connected to respective sides thereof, an input resistor connected between said input terminal and the other side of said line, an output resistor connected between said output terminals, said output terminal on said one side of said line being connected to said control electrode, a capacitor coupling the other of said output terminals to said cathode, and means for impressing a pulse in a positive sense on said amplifier between said input terminal and said point of reference potential, whereby said pulse appears after a predetermined time delay between said control electrode and said point, said output resistance and said resistors being so proportioned that a substantial portion of said pulse appears between said cathode and said control electrode.

GUILFORD L. HOLLINGSWORTH.

REFERENCES CITED

The following references are of record in the file of this patent:

UNITED STATES PATENTS

| Number | Name | Date |
|---|---|---|
| 2,211,942 | White | Aug. 20, 1940 |
| 2,265,996 | Blumlein | Dec. 16, 1941 |
| 2,435,331 | Street | Feb. 3, 1948 |